United States Patent Office 3,573,918
Patented Apr. 6, 1971

3,573,918

UNDERLAYERS OF PLASTICIZER-POLYMER MIXTURES FOR PHOTOPOLYMER THERMAL TRANSFER ELEMENTS

Vaughan Crandall Chambers, Jr., Wilmington, Del., and David W. Woodward, Little Silver, N.J., assignors to E. I. du Pont de Nemours and Company, Wilmington, Del.

No Drawing. Continuation-in-part of application Ser. No. 375,628, June 16, 1964. This application Sept. 26, 1967, Ser. No. 670,755
Int. Cl. G03c *11/12, 1/68*
U.S. Cl. 96—87 12 Claims

ABSTRACT OF THE DISCLOSURE

A photopolymerizable thermal transfer element comprising (1) a support, (2) a thermoplastic stratum comprising a compatible mixture of about 90 to 50 parts of thermoplastic polymer and about 10 to 50 parts of plasticizer, said mixture being solid below 40° C. and (3) over said thermoplastic stratum a photopolymerizable stratum which is solid below 40° C. and has a stick temperature above about 40° C. and below 150° C. in its unexposed state and a stick temperature in its exposed state of at least 10° C. greater than that of its unexposed state.

This application is a continuation-in-part of our copending application Ser. No. 375,628, filed June 16, 1964 (now abandoned).

This invention relates to radiation-sensitive elements for image reproduction and more particularly to such elements wherein images are formed by photopolymerization techniques. More particularly this invention relates to radiation-sensitive photopolymerizable elements which are especially suitable for thermal transfer processes.

Various elements useful for producing copies of an image by thermal transfer are known. Some of the elements which are useful in thermal transfer processes and which are carried out by dry addition photopolymerization reactions are those disclosed in assignee's Burg & Cohen U.S. Pats. 3,060,023; 3,060,024; 3,060,025; Heiart, U.S. Pat. 3,060,026; and Seide application Ser. No. 340,-491, filed Jan. 27, 1964, U.S. Pat. 3,376,136, Apr. 2, 1968. While the above elements and processes offer outstanding advantages over the prior art methods of producing copies by thermal transfer, such elements are somewhat limited in the scope of their application. For example, such elements do not lend themselves readily to processes where it is desirable to achieve complete transfer of the unexposed photopolymerizable stratum and provide a clear, sharp, positive image on the receptor layer and an equally clear, sharp, negative image which remains on the original support. It is also difficult to transfer an image which is non-tacky and where the background is free of stain, particularly where non-polymeric dyes and pigments are incorporated in the photopolymerizable composition. It has been found that in making reflex exposures on the radiation sensitive elements containing the dye or pigment in the photopolymerizable stratum, attenuation of the actinic radiation in thin layer causes an unacceptable loss in image contrast.

An object of this invention is to provide new and improved photopolymerizable elements suitable for thermal transfer processes. A further object is to provide an element which may be used simply and dependably in simple and economical apparatus. A further object is to provide a photopolymerizable thermal transfer element which allows one to completely transfer the unexposed areas of the image leaving clear sharp negatives on the original support and clear sharp positives on the receptor sheet. A still further object is to provide a photopolymerizable thermal transfer element which provides transferred images which are non-tacky and free of background stain. Yet a further object is to provide photopolymerizable thermal transfer elements which have very little or no toxic effects on contact with the skin. Other objects will appear hereinafter.

These and other objects are accomplished by the photopolymerizable thermal transfer elements of this invention which comprise a support bearing in order thereon, (1) a thermoplastic stratum solid below 40° C. and (2) over said thermoplastic stratum a photopolymerizable stratum which is solid below 40° C., has a stick or transfer temperature above 40° C. and below 150° C. in its unexposed state and has a stick temperature in its exposed state of at least 10° C. greater than that of the unexposed state, said layers being substantially non-diffusible in each other and said thermoplastic stratum being fluid or readily deformable at or below the stick or transfer temperature of the unexposed superposed layer (2). The melting point of the thermoplastic stratum must be less than the stick temperature of exposed photopolymer and is generally equal to or less than the stick temperature of the unexposed photopolymer.

Preferably, the adhesive value of the exposed photopolymer to the image receptor should be between about 0.5 gram/linear inch and 10 grams/linear inch and the cohesion value of the unexposed photopolymer should be at least about 15 grams linear inch and the cohesion of the thermoplastic layer must be less than 15 grams/linear inch and greater than 0.5–10 grams/linear inch (all measured at the same temperature) as determined by the Instron tensile testing machine manufactured by the Instron Engineering Corporation of Quincy, Mass. This test merely involves making transfer laminates of one inch wide strips of both exposed and underexposed photopolymerizable elements laminated to the receptor supports and, at the transfer temperature, measuring the load necessary to peel the films apart.

The term "underexposed" as used herein is intended to cover the image areas which are completely unexposed or partially exposed, so that insufficient polymerization has occurred to prevent thermal transfer of such area at temperatures where the exposed areas will no longer transfer to the image-receptive element. The term "transfer" temperature means the temperature at which the unexposed image areas in question stick or adhere, within 10 seconds, under slight pressure, e.g., thumb pressure, to analytical filter paper (Schleicher & Shuell analytical filter paper #595).

The lower non-polymerizable thermoplastic layer not only should have the above physical characteristics, but, in addition, it should not dissolve ingredients from the photopolymer layer upon aging and at temperatures up to the transfer temperatures.

The thermoplastic compositions which are especially useful in this invention are those comprising plasticized and unplasticized polymers derived from terpenes, polymerized olefins, vinyl halide polymers, vinyl ester polymers, acrylic and alkacrylic polymers, phenol modified resins, natural polymers, e.g., resins, cellulose ethers, phenol modified resins. Polymers derived by copolymerizing with monomers of the above synthetic polymers may also be useful. For example, polyethylene and ethylene/vinyl acetate copolymers are quite useful in the invention.

Plasticizers for these polymers may be added to control the melting or stick temperature. These include esters such as triethylene glycol diacetate, dibutyl phthalate, tricresyl phosphate or a variety of waxes. Waxes useful in the above mixtures are those disclosed in assignee's Burg application, U.S. Ser. No. 234,214, filed Oct. 30, 1962, U.S.

Pat. 3,203,805, Aug. 31, 1965. Candelilla, Castor wax and the paraffins have been found particularly efficacious when used in admixture with the above mentioned polyethylene and ethylene/vinyl acetate polymers. A preferred thermoplastic undercoating composition is composed of 70 parts of ethylene/vinyl acetate copolymer containing 30–32% by weight of vinyl acetate and having an inherent viscosity at 30° C. (0.25% in toluene) of 0.77 and having an average molecular weight of 300,000 and 30 parts of a highly refined paraffin wax (M.P. ca. 52° C.). The undercoat is coated from a 10% benzene solution. Generally the plasticizers are present in amounts of about 10 to 50 parts by weight and the thermoplastic composition is present in amounts of 90 to 50 parts by weight. Preferably the plasticizer is present in amounts of about 25 to 50 parts by weight.

The photopolymerizable composition may be one of those described in assignee's Burg, U.S. Pat. 3,060,023 dated Oct. 23, 1962 and may contain a colorant which may be any of those described in said Burg patent or may be any one of the polymeric dyes described in assignee's Seide application, S.N. 340,491, filed Jan. 27, 1964, 3,376,136. The coloring matter may, however, be in the thermoplastic undercoat, particularly when it is desired to make the image exposures by reflex methods. In addition to the ethylenically unsaturated compounds containing at least one terminal ethylenic group as the monomeric compounds described in the Burg patent, other monomeric compounds such as those disclosed in assignee's Celeste & Seide, U.S. Ser. No. 274,909 filed Apr. 23, 1963, U.S. Pat. 3,261,686, July 19, 1966 may be used.

Any of the supports useful in the above patent references are also suitable in the instant invention and this is also true for the receptor support. A subbing of vinylidene chloride/methyl acrylate/itaconic acid as disclosed in Alles et al., U.S. Pat. 2,627,088 is preferably used before coating the support with the thermoplastic composition.

The element preferably has a laminated protective layer such as wax, drafting film or the films as described in assignee's U.S. Pat. 3,060,026 to Heiart.

Prior to the transfer of a portion of the photopolymerizable layer (in underexposed areas), a portion of the layer is exposed to actinic radiation. This may be through a two-tone image or a process transparency, e.g., a process negative or positive (an image-bearing transparency consisting solely of substantially opaque and substantially transparent areas where the opaque areas are substantially of the same optical density, the so-called line or halftone negative or positive). The image or transparency may or may not be in operative contact with the surface of the photopolymerizable layer, e.g., contact exposure or projection exposure. It is possible to expose through paper or other light transmitting materials; however, a stronger light source or longer exposure times must be used.

Reflex exposure techniques are also useful in this invention, particularly when office copies are made. By using reflex exposure, copies can be made from opaque supports, e.g., paper cardboard, metal, etc., as well as from poor light transmitting surfaces with excellent resolution, especially when the coloring matter for making the transferred image visible is incorporated in the thermoplastic underlayer. Of course, in the case of reflex exposures, the matrix must transmit sufficient light to effect polymerization.

After the exposure of the photopolymerizable layer, the exposed composition is brought into contact with the receptor while simultaneously heat is applied to effect the transfer of the underexposed areas of the photopolymerizable composition. This transfer gives directly a right reading positive. While the heat is preferably applied simultaneously with the contact of the exposed element to the receptor, the heat can be applied at any stage of the process prior to the separation step to either or both elements provided the temperatures correspond to the transfer temperature of the photopolymerizable stratum. Heat can be applied by means well known to the art, e.g., rollers, flat or curved heating surfaces or platens, radiant sources, e.g., heating lamps, etc.

The heating temperature can range from above 40° C. to about 150° C. or slightly above and the contact time is usually for 0.1 to 10 seconds. In general about 0.1 second is adequate and shorter periods of contact are possible by using an intense radiant source of heat, e.g., infrared lamps or heat sources. Preferably the stratums are selected so that the transfer temperature range is 55° C. to 120° C. Suitable exposing machines for carrying the above processes are those disclosed in assignee's Heiart & Velvel, U.S. Ser. No. 234,616 filed Nov. 1, 1962, U.S. Pat. 3,211,-074, Oct. 2, 1965 and Cohen, U.S. Ser. No. 250,856 filed Jan. 11, 1963, now abandoned.

The invention will be further illustrated by, but is not intended to be limited to the following detailed examples.

EXAMPLE 1

(I) Photopolymerizable coating composition

A coating solution was prepared by mixing 2.5 grams of pentaerythritol triacrylate monomer, 2.0 grams of cellulose acetate butyrate containing 37% butyryl groups, 13% acetyl groups and having a viscosity of 1.12–1.88 poises (as determined by ASTM method D–1343–54T in the solution described as Formula A, ASTM method D-871–54T); 0.5 gram of 2-ethylanthraquinone, 1.0 gram of 30.7% solids in methyl Cellosolve solution of a reaction product of methylamine and polyethylene glycol dichloride (sold as "ASTON" 108 by Onyx Oil & Chemical Corp.); 0.0446 gram of glacial acetic acid; 2.5 grams of a 15% by weight carbon black having a particle size of 13 millimicrons in a dispersion in isopropanol (sold as Neo Spectra Mark II by Columbian Carbon Company); and 13.0 grams of acetone to give a 26.6% solids in a solution.

(II) Thermoplastic undercoating composition

A coating solution was prepared from 7.0 grams of an ethylene/vinyl acetate copolymer containing 30–32% by weight of vinyl acetate and having an inherent viscosity at 30° C. (0.25% in toluene) of 0.77 and having a molecular weight of about 300,000; 3.0 grams of paraffin wax having a melting point of about 52° C. and 90 grams of benzene.

(III) Coating procedure

Solution II was coated on a 4-mil thick polyethylene terephthalate support bearing a subcoat of a copolymer of vinylidene chloride/methyl acrylate/itaconic acid as disclosed in Alles et al., U.S. Pat. 2,627,088. The coating was made using a doctor knife and after drying for 20 minutes the final thickness was about 0.2 mil. It was then overcoated with coating composition (I) using the doctor knife as with solution II. After drying for 30 minutes the surface of the resulting photopolymerizable layer which had a dry thickness between 0.1 and 0.2 mil was pressure laminated to a 0.5 mil polyethylene terephthalate film with a laminating pressure of approximately 2 pounds per inch of roller length.

(IV) Exposure and transfer procedure

The element resulting from step III above was given a two minute exposure through a photographic positive in face to face contact with the laminated surface by means of an exposing device identified as a Nu Arc Plate Maker (flip-flop) manufactured by the Nu Arc Company, Chicago, Ill., whereby photopolymerization took place in the areas which were exposed to light.

After exposure, the pressure laminated film base was removed and the surface of the exposed layer was placed in contact with a bond paper receptor sheet and the superposed elements were passed through pressure rollers at about 100° C. and 2½ pounds of force per linear inch of the rollers. The paper was separated from the element at is emerged from the rollers. A clear, sharp, black negative image remained on the original element and an equally clear sharp black positive image having good density was obtained on the receptor sheet. There was no evidence of background stain and there was no evidence of tackiness in either the remaining negative layer or the transferred positive layer. This indicates that separation during thermal transfer occurred within the thermoplastic underlayer.

EXAMPLE 2

Example 1 was repeated except that the photopolymerizable coating composition (I) was made by mixing together 10.0 grams of a monomeric compound of the triacrylate of the reaction product of trimethylol propane with 20 moles of ethylene oxide made according to assignee's application, "Polymerizable Compositions and Elements" by Cohen and Schoenthaler filed May 26, 1964, Ser. No. 370,338 (U.S. Pat. 3,380,831, Apr. 30, 1968); 10.0 grams of methoxypolyethylene glycol hydrogen succinate having a molecular weight of 850; 80.0 grams of a 25% solids acetone solution of a poly(methyl methacrylate) having an average molecular weight less than 100,000; 2.0 grams of 2-ethylanthraquinone, 20.0 grams of carbon black (15% solids dispersion in isopropanol); 1.0 gram of polyoxyethylene lauryl ether nonionic wetting agent (sold as "Brij"–30 by Atlas Powder Company); 50 grams of acetone to give a 26.6% solids in solution. A layer of this material gave a cohesion of unexposed photopolymer as 31.1 grams per linear inch measured as described above using a bond paper receptor. Adhesion of the exposed photopolymer to a bond paper receptor and cohesion of the thermoplastic layer gave measurements of 0.95 and 12.2 grams/linear inch respectively.

All other steps (II), (III), and (IV) were carried out as in Example 1 with the resulting black and white images similar in sharpness and clarity to the results in that example.

EXAMPLE 3

Example 1 was repeated except that the photopolymerizable composition (I) was made by mixing together 5.0 grams of the monomeric compound of Example II; 2.5 grams of triethylene glycol diacetate; 2.5 grams of methoxypolyethylene glycol hydrogen succinate (M.W. 850); 8.8 grams of the cellulose acetate butyrate of Example 1; .75 gram of 2-ethylanthraquinone, 7.5 grams of the carbon black dispersion of Example 1 and 30.45 grams of acetone to give a 36.0% solids in solution.

All other steps, (II), (III), and (IV) were carried out as in Example 1 with similar results in the quality of the transferred and untransferred images.

EXAMPLE 4

A photopolymerizable element was prepared, exposed and the pressure laminated film removed as in Example 1 up to the laminate removal of procedure (IV). The element was then placed in intimate contact with a No. 4000 offset master (manufactured by A. B. Dick Company) and the thermal transfer process carried out as in Example 1. The offset master then was placed in an offset press, etched and inked in a conventional manner and used to make several hundred copies of good quality.

EXAMPLE 5

A photopolymerizable element was prepared by coating the solutions of (II) and (I) of Example 1 in that order on a one mil polyethylene terephthalate film support as described in Example 1. The coated element was then laminated with the surface of the photopolymerizable layer in contact with the drawing surface of a translucent drafting film made according to Example 1 of assignee's Van Stappen, U.S. Pat. 2,964,423 thus providing an integral photopolymerizable thermal transfer element-receptor product.

The exposure and transfer operations were carried out by exposing through a positive transparency in contact with the film support on which the thermoplastic underlayer is coated, or in other words, through the back of the photopolymerizable element to the same radiation source as described in Example 1. After exposure the laminated structure is separated after heating as described in step (IV) of Example 1.

A clear, sharp positive having excellent legibility was obtained on the drafting film while a negative having the same excellent qualities remained on the original support. Neither the positive nor negative gave any indication of tackiness at room temperature nor was there any evidence of background stain.

EXAMPLE 6

A color proof was made in the following manner:

Photopolymerizable coating solutions

Solution A—Same as Solution I in Example 1.

Solution B—A coating solution was made by mixing together 2.79 grams of pentaerythritol triacrylate monomer; 2.17 grams of the cellulose acetate butyrate used in Solution A above, 1.0 gram of the methyl Cellosolve solution of Example 1 above; 0.0446 gram of acetic acid; 0.558 gram of 2-ethylanthraquinone; 0.558 gram Lithosol Fast Yellow HV(C.I. Pigment Yellow 1) and 14.4 grams of acetone to give a 31.5% solids in solution.

Solution C—A coating solution was made the same as Solution B except that 0.468 gram of Lithosol Red CSP (C.I. Pigment Red 48) was used in place of the Lithosol Fast Yellow.

Solution D—A coating solution was made the same as Solution B except that 0.468 gram of Monastral Blue B (phthalocyanine pigment) (C.I. Pigment Blue 15) was used in place of Lithosol Fast Yellow.

Four pieces of 4-mil polyethylene terephthalate film base coated with Thermoplastic Undercoating Composition (II) as in Example 1 were coated with Solutions A, B, C and D respectively and each sample was exposed through the appropriate separation positive and successively transferred in register to a common paper receptor sheet to provide a full color positive proof. Color separation negative transparencies were left on the original supports.

EXAMPLE 7

Example 1 was repeated except that in step III of that example, instead of pressure laminating the coated photopolymerizable layer to a 0.5 mil polyethylene terephthalate film, it was coated with a stratum of wax of about 0.2 mil dry thickness. The wax used for coating was a paraffin wax (fully refined paraffin wax, M.P. 52° C.). The wax was skim-coated from the melted mixture and doctored to the desired thickness by means of an air-knife blowing heated air.

Upon carrying out procedure (IV) with the exception that the wax coating was not removed, it was found that there was good image transfer and that the wax overcoat did not substantially change the relationship of the cohesion of the thermoplastic layer being less than the photopolymer adhesion to the receptor in the unexposed areas (i.e., only negligible interference with transfer).

EXAMPLE 8

(I) Photopolymerizable composition

A coating composition was made by mixing 3.0 grams of pentaerythritol triacrylate; 10 grams of acetone; 1 gram of methanol; 2.0 grams of the cellulose acetate butyrate disclosed in Example 1; 1.0 gram of methoxy polyethylene glycol hydrogen succinate (M.W. 850); 0.04 gram of phenanthrenequinone, sufficient acetone to make the total up to 20 grams.

(II) Thermoplastic coating composition

A coating composition was prepared from 2.0 grams of Pigment Fast Black TV Powder (sold by Verona Dyestuffs, Union, N.J.); 5.0 grams of the ethylene/vinyl acetate copolymer of Example 1; 5.0 grams of paraffin wax (M.P. 52); 0.2 gram of poly-(hydroxytitanium stearate) having a molecular weight above 40,000, and benzene to make 100 grams.

(III) Coating procedure

Solution II was coated on a 4-mil thick polyethylene terephthalate support bearing a subcoat of a copolymer of vinylidene chloride/methyl acrylate/itaconic acid as disclosed in Alles et al., U.S. Pat. 2,627,088. The coating was made using an air knife doctor with a clearance of 2 mils and after drying for 20 minutes it was overcoated with photopolymer coating composition (I) using the same air knife doctor setting as with solution II. After drying for 30 minutes the element was overcoated with a paraffin wax having a melting point of 52° C. in the manner described in Example 7.

The dried layer was given a reflex exposure to an original image using a 20 watt blue fluorescent lamp for 1.6 seconds. Five transfers were made at temperatures of approximately 117° C. as described above and at the end of the fifth transfer a clear negative remained on the film support and a positive image somewhat lower in color density than the first transfer but still quite legible was found on the receptive support. The unexposed photopolymer is removed on the first transfer and the remaining transfers give a positive from the pigment carrying wax-copolymer.

EXAMPLE 9

(I) Photopolymerizable composition

A coating composition was made by thoroughly mixing by means of a ball-mill, 3.0 grams of polymethyl methacrylate (inherent viscosity 0.20–0.22 for a solution of 0.25 gram in 50 mls. chloroform, at 20° C., using a No. 50 Cannon-Fenske viscosimeter), 1.4 grams of triethylene glycol diacetate, 1.6 grams of pentaerythritol triacrylate (M.W. 300), 0.4 gram of 2-ethyl-9,10-anthraquinone, 0.6 gram of carbon black (particle size 13 millimicron) and 40.0 grams of acetone. The mixture was coated on the surface of a sheet of 0.5 mil thick polyethylene terephthalate film support to give a dry thickness of 0.39 mil.

(II) Thermoplastic composition

A coating composition was prepared from 3.2 grams of the polymethyl methacrylate described above, 2 grams of triethylene glycol diacetate and 15 grams of benzene. The solution was coated on the film base described in III of Example 1 to give a dry layer having thickness of 0.5 mil.

The surface of the above coating was laminated to the surface of the photopolymerizable layer I above at a pressure of approximately 2 pounds per inch of roller length.

The element was exposed for 4 minutes in the instrument described under IV of Example 1 above and the 0.5 mil polyethylene terephthalate film was removed. The surface of the exposed layer was placed in contact with a sheet of the translucent drafting film described in Example 5 and the superposed elements were passed through pressure rollers at about 95° C. and 2½ pounds of force per linear inch of rollers. The translucent drafting film and 4 mil subbed polyethylene terephthalate films were separated as the element emerged from the rollers. A clear, sharp, black negative remained on the 4 mil polyethylene terephthalate film and an equally clear sharp black positive having good density was obtained on the translucent drafting film. There was no evidence of background stain and there was no evidence of tackiness in either the negative or the transferred positive layer.

While in the above example where the wax-copolymer containing the coloring matter gives multiple copies using the element structure of this invention, the main advantage of the invention lies in the ability to completely transfer the unexposed areas imagewise to the receptor sheet so that a clear sharp negative remains on the original film support and a clear sharp positive is attached to the receptor sheet.

In addition to the preferred waxes indicated above, other waxes which are compatible with the thermoplastic polymers mentioned earlier may also be used. As indicated above, such waxes are disclosed in assignee's Burg application U.S. Ser. No. 234,214 filed Oct. 30, 1962, 3,203,805. The ratio of wax to polymer is not critical so long as the adhesion of the exposed photopolymerizable material to the receptor is less than the cohesion of the thermoplastic-wax stratum and the cohesion of the unexposed photopolymerizable material is greater than that of said thermoplastic-wax stratum and the wax is compatible with the thermoplastic polymer. Usually the composition will vary from 25 parts by weight wax to 75 parts polymer to 50 parts by weight of each.

In addition to the specific thermoplastic resins mentioned above, polyisobutylene, vinyl chloride polymers, butyl and isobutyl methacrylate polymers, ethylene/methyl acrylate copolymers, ethylene/butylene copolymers, polypropylenes and ethyl cellulose may also be used.

A wide range of photopolymerizable compositions can be used in the preparation of the elements. The compositions are such that they do not soften at temperatures below 40° C. and do not undergo any essential change in softening temperature by holding for up to 15 seconds at the original softening temperature of the composition (i.e., not easily thermopolymerized).

Suitable viscosity-modifying agents for the photopolymerizable and thermoplastic compositions include thermoplastic compounds, e.g., (A) copolyesters, e.g., those prepared from the reaction product of a polymethylene glycol of the Formula $HO(CH_2)_nOH$, wherein $n$ is a whole number 2 to 10 inclusive, and (1) hexahydroterephthalic, sebacic and terephthalic acids, (2) terephthalic, isophthalic and sebasic acids, (3) terephthalic and sebacic acids, (4) terephthalic and isophthalic acids, and (5) mixtures of copolyesters prepared from said glycols and (i) terephthalic isophthalic and sebacic acids and (ii) terephthalic, isophthalic, sebacic and adipic acids;

(B) nylons or polyamides, e.g., N-methoxymethyl polyhexamethylene adipamide;

(C) vinylidene chloride copolymers, e.g., vinylidene chloride/acrylonitrile; vinylidene chloride/methylacrylate and vinylidene chloride/vinylacetate copolymers;

(D) cellulosic ethers, e.g., methyl cellulose, ethyl cellulose and benzyl cellulose;

(E) polyethylene;

(F) synthetic rubbers, e.g., butadiene/acrylonitrile copolymers, and chloro-2-butadiene-1,3 polymers;

(G) cellulose esters, e.g., cellulose acetate, cellulose acetate succinate and cellulose acetate butyrate;

(H) polyvinyl esters, e.g., polyvinyl acetate/acrylate, polyvinyl acetate/methacrylate and polyvinyl acetate;

(I) polyacrylate and alpha-alkyl polyacrylate esters, e.g., polymethyl methacrylate and polyethyl methacrylate;

(J) high molecular weight polyethylene oxides of polyglycols having average molecular weights from about 4,000 to 1,000,000;

(K) polyvinyl chloride and copolymers, e.g., polyvinyl chloride/acetate;

(L) polyvinyl acetal, e.g., polyvinyl butyral, polyvinyl formal;

(M) polyformaldehydes;

(N) polyurethanes;

(O) polycarbonates;

(P) polystyrenes;

(Q) extralinear unsaturated polyamides, e.g., N-acrylyloxymethyl and N-methacrylyloxymethyl polyamides. When the photopolymerizable stratum comprises ethylenically unsaturated polymeric compositions capable of further polymerization or crosslinking as are described below, plasticizing agents such as low molecular weight polyalkylene oxides, ethers and esters, e.g., triethylene glycol dicaprylate, polypropylene glycol mono-n-butyl ether; and other esters such as phthalates, e.g., dibutyl phthalate; adipates, e.g., diisobutyl adipate; sebacates, e.g., dimethyl sebacate, can be used. In addition, phosphates, e.g., tricresyl phosphate; amides and sulfonamides, e.g., n-ethyl-p-toluene-sulfonamide; carbonates, e.g., bis(dimethylbenzyl) carbonate; citrates, e.g., triethyl citrate; glycerol esters, e.g., glycerol triacetate; laurates, e.g., n-butyl laurate; oleates, stearates, etc., and sucrose octacetate are also useful.

To the thermoplastic polymer modifier constituent of the photopolymerizable composition there can be added nonthermoplastic polymeric compounds to improve certain desirable characteristics, e.g., adhesion to the thermoplastic stratum, adhesion to the image-receptive support on transfer, wear properties, chemical inertness, etc. Suitable non-thermoplastic polymeric compounds include polyvinyl alcohol, cellulose, anhydrous gelatin, phenolic resins and melamine-formaldehyde resins, etc. If desired, the photopolymerizable layers can also contain immiscible polymeric or non-polymeric organic or inorganic fillers or reinforcing agents which are essentially transparent at the wavelengths used for the exposure of the photopolymeric material, e.g., the organophilic silicas, bentonites, silica, powdered glass, colloidal carbon as well as various types of dyes and pigments. Such materials are used in amounts varying with the desired properties of the photopolymerizable layer. The fillers are useful in improving the strength of the composition, reducing tack and, in addition, as coloring agents.

The ethylenically unsaturated compounds which are capable of polymerizing or forming a high polymer in a short period of time by photoinitiated, chain-propagating, addition polylmerization can be any of the monomeric compounds disclosed in Plambeck U.S. Pat. 2,760,863. Preferably the compounds are non-gaseous at 20° C. and atmospheric pressure, have 1 or more terminal ethylenic groups, preferably 2 or more, and a plasticizing action on the thermoplastic polymer in addition to its other properties disclosed above. Suitable compounds, which may be used alone or in combination, include preferably an alkylene or a polyalkylene glycol diacrylate prepared from an alkylene glycol of 2 to 15 carbons or a polyalkylene ether glycol of 1 to 10 ether linkages, and those disclosed in Martin & Barney U.S. Pat. 2,927,022, issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such hetero atoms as nitrogen, oxygen and sulfur. Outstanding are such materials wherein the ethylenically unsaturated groups, especially the vinylidene groups are conjugated with ester or amide structures. The following specific compounds are further illustrative of this class: unsaturated esters of alcohols, preferably polyols, and particularly such esters of the alphamethylene carboxylic acids, e.g., ethylene glycol diacrylate, diethylene glycol diacrylate, glycerol diacrylate, glycerol triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, pentaerythritol triacrylate and trimethacrylate, pentaerythritol tetraacrylate and tetramethylacrylate, 1,3-propanediol diacrylate, 1,5-pentanediol dimethacrylate, the bis-acrylates and methacrylates of polyethylene glycols of molecular weight 200–1500, and the like; unsaturated amides, particuarly those of the alphamethylene carboxylic acids, and especially those of alpha, omega-diamines and oxygen-interrupted omega-diamines, such as methylene bisacrylamide, methylene bis-methacrylate, ethylene bis-methacrylamide, 1,6-hexamethylene bisacrylamide, diethylene triamine tris-methacrylamide, bis-(gamma-methacrylamidopropoxy) ethane beta-methacrylamidoethyl methacrylate, N - (beta-hydroxyethyl)-beta-(methacrylamido)ethyl acrylate and N,N-bis(beta-methacrylyl-oxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate, styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamines wherein the molecular chain between the hydroxyls and amino groups is solely carbon or oxygen-interrupted carbon. The preferred monomeric compounds are di- or poly-functional, but monofunctional monomers can also be used. The amount of monomer added varies with the particular thermoplastic polymer used.

The ethylenic unsaturation can be present as an extralinear substituent attached to a thermoplastic linear polymer, such as polyvinyl acetate/acrylate, cellulose acetate/acrylate, cellulose acetate/methacrylate, N-acrylyloxymethylopolyamide, N - methacrylyloxymethylpolyamide, allyloxymethylpolyamide, etc., in which case the polymerizable monomer and the polymer modifier functions are combined in a single material.

A preferred class of free-radical generating addition polymerization initiators (c) activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethyl-anthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2 - phenylanthraquinone, 2,3-diphenylanthraquinone, sodium salt of anthraquinone alphasulfonic acid, 3-chloro-2-methylanthraquinone, retenequinone, 7,8,9,10 - tetrahydronaphthacenequinone, and 1,2,3,4 - tetrahydrobenz(a)anthracene-7,12-dione. Certain aromatic ketones, e.g., benzophenone, are also useful as are the following photoinitiators, some of which may be thermally active at temperatures as low as 85° C., e.g., those described in Plambeck U.S. Pat. 2,760,863 and include vicinal ketaldonyl compounds, such as diacetyl, benzil, etc.; alphaketaldonyl alcohols, such as benzoin, pivaloin, etc.; acyloin ethers, e.g., benzoin methyl and ethyl ethers, etc.; alphahydrocarbon substituted aromatic acyloins, including alphamethylbenzoin, alpha-allylbenzoin, and alpha - phenylbenzoin. Silver persulfate is also useful as a free-radical generating initiator activatable by actinic radiation.

Suitable thermal polymerization inhibitors (d) useful in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and di-nitrobenzene, in addition to p-toluquinone and chloranil.

Various dyes, pigments, thermographic compounds, and color-forming components can be added either to the wax underlayer or to the photopolymerizable compositions to give varied results after the thermal transfer. These additive materials, however, preferably should not absorb excessive amounts of radiation at the exposure wave length or inhibit the polymerization reaction. In some instances, however, e.g., in direct exposure through a negative absorption of the colorant is not critical when the coolant is in the underlayer.

Among the useful dyes are Fushsine (CI 42510), Auramine Base (CI 41000B), Calcocid Green S (CI 44090), Para Magenta (CI 425000), Tryparosan (CI 42505), New Magenta (CI 42520), Acid Violet RRL (CI 42425), Red Violet 5RS (CI 42690), Nile Blue B (CI 51185), New Methylene Blue GG (CI 51195), CI Basic Blue 20 (CI 42585), Iodine Green (CI 42556), Night Green B (CI 42115), CI Direct Yellow 9 (CI 19540), CI Acid Yellow 17 (CI 18965), CI Acid Yellow 29 (CI 18900), Tartrazine (CI 19140), Supramine Yellow G (CI 19300), Buffalo Black 10B (CI 27790), Naphthalene Black 12R (CI 20350), Fast Black L (CI 51215), and Ethyl Violet (CI 42600).

Suitable pigments include, e.g., $TiO_2$, colloidal carbon, graphite, phosphor particles, ceramics, clays, metal powders such as aluminum, copper, magnetic iron and bronze, etc. The pigments are useful when placed in the photosensitive layer or in an adjacent non-photosensitive layer.

Useful thermographic additives, e.g., 3-cyano-4,5-dimethyl - 5 - hydroxy - 3 - pyrrolin-2-one are disclosed in Howard, U.S. Pat. No. 2,950,987. Such compounds, in the presence of activators, e.g., copper acetate, are disclosed in assignee's Belgian Pat. No. 588,328. Other useful thermographic additives are disclosed in the following U.S. Pats. 2,625,494; 2,637,657; 2,663,654; 2,663,655; 2,663,656 and 2,663,657.

Suitable color-forming components which form colored compounds on the application of heat or when brought in contact with other color-forming components on a separate support include (1) Organic and inorganic components: dimethyl glyoxime and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone.

(2) Inorganic components: ferric salts and potassium thiocyanate; ferrous salts and potassium ferricyanide; copper, mercury or silver salts and sulfide ions; lead acetate and sodium sulfide.

(3) Organic components: 2,4-dinitrophenylhydrazine and aldehydes or ketones; diazonium salt and phenol or naphthol, e.g., benzene diazonium chloride and beta-naphthol; substituted aromatic aldehydes or amines and a color photographic developer compound, e.g., p-dimethylaminobenzaldehyde and p-diethylaminoaniline; color photographic developer compound/active methylene compound and an oxidizing agent, e.g., p-diethylaminotoluidine/$\alpha$-cyanoacetophenone and potassium persulfate.

The photopolymerizable thermal transfer elements of this invention are preferably about 0.0005 to 0.010 inch thick where the support is about 0.0004 to 0.0008 inch the thermoplastic stratum is about 0.00005 to 0.0003 inch and the photopolymerizable stratum is about 0.00005 to 0.002 inch. Suitable support materials are stable at the operating temperatures used in the instant invention. Suitable bases or supports include those disclosed in U.S. Pat. 2,760,863, glass, wood, paper (including waxed or transparentized paper), cloth, cellulose esters, e.g., cellulose acetate, cellulose propionate, cellulose butyrate, etc., and other plastic compositions such as polyamides, polyesters, e.g., polyethylene terephthalate; polyolefins, e.g., polyethylene and polypropylene. The support may have in or on its surface and beneath the photopolymerizable stratum an antihalation layer as disclosed in said patent or other substrata needed to facilitate anchorage to the base, and/or may have an antiblocking or release coating on the back surface, e.g., finely divided inert particles in a polymeric binder, for instance, silica in gelatin.

The above-described element may be used in an image-reproducing process including the steps of exposing said element imagewise to actinic radiation at atmospheric conditions until polymerization, with an accompanying increase in stick temperature, of the photopolymerizable stratum takes place in the exposed image areas with substantially less polymerization and less increase in stick temperature in the underexposed, complementary, adjoining coplanar image areas to provide a difference of at least 10° C. in the stick temperature of said exposed and underexposed areas and subsequently transferring said image corresponding to the underexposed image areas and the overlying cover stratum by bringing the surface of the exposed element into operative contact with the surface of an image-receptive support at an operating temperature intermediate between the stick temperature of said exposed and underexposed areas and at least equal to the melting point of said wax-polymer undercoat and subsequently separating the two surfaces at a temperature intermediate between the stick temperatures of the exposed and underexposed image areas.

The image-receptive support to which the image is transferred must be stable at the operating temperatures. The particular support used is dependent on the desired use for the transferred image and on the adhesion of the image to the base. Suitable supports include paper including bond paper, resin and clay sized paper, resin coated or impregnated paper, cardboard, aluminum, copper, steel, bronze, etc.; wood, glass, nylon, rubber, polyethylene, linear condensation polymers such as the polyesters, e.g., polyethylene terephthalate, regenerated cellulose, cellulose esters, e.g., cellulose acetate; silk, cotton, viscose rayon and metal fabrics or screens. The image-receptive support may have a hydrophilic surface or may contain on its surface chemical compounds which react with compounds being transferred so as to produce differences in color, hydrophilicity or conductivity between the exposed and underexposed areas or for improved adhesion to or brightening of the receptive support. The image-receptive surface may be smooth, contain roughening agents such as silica, be perforated or be in the form of a mesh or screen.

Lithographic surfaces can be produced by thermally transferring a hydrophobic layer of the element to a hydrophilic receptor surface or vice versa. The images on the lithographic surface can be made impervious to chemical or solvent attack by postexposing the lithographic surface. Alternatively, the exposed areas of the photopolymerizable element, after the underexposed areas are transferred, can be used as a lithographic-offset printing plate if they are hydrophobic and the original sheet support is hydrophilic or vice versa. The element and process are also useful for making silk screens.

The advantages of this invention are due to the improved photopolymerizable element bearing on a support a thin, thermoplastic mixture of a wax-polymer layer under the light-sensitive layer, both layers being substantially non-diffusible in each other.

The wax-polymer underlayer can be easily coated using conventional coating equipment.

The use of the thermoplastic underlayer allows one to obtain clear sharp negative and positive images from a single exposure of a photopolymerizable thermally transferable element, an accomplishment not possible heretofore. The resulting images are uniform in density throughout which is important in many operations including color-proofing. The transferred layer has a layer of wax-polymer composition as a surface coating which is non-tacky and has no toxic effects on the skin which reduces handling problems caused by certain skin irritating photopolymerizable acrylates. The invention also provides elements which give images free of background stain.

What is claimed is:

1. A photopolymerizable thermal transfer element comprising (1) a support, (2) a thermpolastic stratum which is solid below 40° C. and (3) over said thermoplastic stratum a photopolymerizable stratum which is solid below 40° C. and has a stick temperature above about 40° C. and below 150° C. in its unexposed state and a stick temperature in its exposed state of at least 10° C. greater than that of its unexposed state; said exposed photopolymer having an adhesive value to a receptor between about 0.5 to 10 grams/linear inch, said unexposed photopolymer having a cohesive value of at least 15 grams/linear inch and the cohesion of said thermoplastic layer being between the exposed photopolymer adhesive value and the unexposed photopolymer cohesive value.

2. A photopolymerizable thermal transfer element as described in claim 1 where said thermoplastic stratum comprises a compatible mixture of thermoplastic polymer and wax.

3. A photopolymerizable thermal transfer element as described in claim 2 where the ratio of polymer to wax is about 75 to 50 parts by weight polymer to about 25 to 50 parts by weight wax.

4. A photopolymerizable thermal transfer element as described in claim 1 where at least one of said stratums contains a colorant.

5. A photopolymerizable thermal transfer element as described in claim 1 where the stick temperature of said exposed state is about 55° C. to 120° C.

6. A photopolymerizable thermal transfer element as described in claim 1 where an atmospheric oxygen barrier covers said photopolymerizable stratum.

7. A photopolymerizable thermal transfer element comprising (1) a support, (2) a thermoplastic stratum comprising a compatible mixture of about 90 to 50 parts of thermoplastic polymer and about 10 to 50 parts of plasticizer, said mixture being solid below 40° C. and (3) over said thermoplastic stratum a photopolymerizable stratum which is solid below 40° C. and has a stick temperature above about 40° C. and below 150° C. in its unexposed state and a stick temperature in its exposed state of at least 10° C. greater than that of its unexposed state, said exposed photopolymer having an adhesive value to a receptor between about 0.5 to 10 grams/linear inch, said unexposed photopolymer having a cohesive value of at least 15 grams/linear inch and the cohesion of said thermoplastic layer being between the exposed photopolymer adhesive value and the unexposed photopolymer cohesive value.

8. A photopolymerizable thermal transfer element as described in claim 7 where said plasticizer is paraffin wax.

9. A photopolymerizable thermal transfer element as described in claim 7 where said photopolymerizable stratum contains a coloring agent.

10. A photopolymerizable thermal transfer element as described in claim 7 where said photopolymerizable stratum is covered with a polyethylene terephthalate film.

11. A photopolymerizable thermal transfer element as described in claim 7 where said photopolymerizable stratum is covered with a translucent drafting film.

12. A photopolymerizable thermal transfer element comprising (1) a support, (2) a thermoplastic stratum comprising a compatible mixture of about 75 to 50 parts of thermoplastic polymer and about 10 to 50 parts of wax, said mixture being solid below 40° C. and (3) over said thermoplastic stratum a photopolymerizable stratum which is solid below 40° C. and has a stick temperature above about 40° C. and below 150° C. in its unexposed state and a stick temperature in its exposed state of at least 10° C. greater than that of its unexposed state; said exposed photopolymer having an adhesive value to a receptor between about 0.5 to 10 grams/linear inch, said unexposed photopolymer having a cohesive value of at least 15 grams/linear inch and the cohesion of said thermoplastic layer being between the exposed photopolymer adhesive value and the unexposed photopolymer cohesive value.

References Cited

UNITED STATES PATENTS

| | | | |
|---|---|---|---|
| 3,036,913 | 5/1962 | Burg | 96—67 |
| 3,036,916 | 5/1962 | Notley | 96—115X |

RONALD H. SMITH, Primary Examiner

U.S. Cl. X.R.

96—28, 115